United States Patent
Asami et al.

(10) Patent No.: US 7,418,864 B2
(45) Date of Patent: Sep. 2, 2008

(54) ACCELERATION SENSOR AND METHOD FOR MANUFACTURING THE SAME

(75) Inventors: Kazushi Asami, Okazaki (JP); Yukihiro Takeuchi, Nishikamo-gun (JP); Kenichi Yokoyama, Nagoya (JP)

(73) Assignee: DENSO CORPORATION, Kariya (JP)

( * ) Notice: Subject to any disclaimer, the term of this patent is extended or adjusted under 35 U.S.C. 154(b) by 10 days.

(21) Appl. No.: 11/384,330

(22) Filed: Mar. 21, 2006

(65) Prior Publication Data

US 2006/0213268 A1     Sep. 28, 2006

(30) Foreign Application Priority Data

Mar. 24, 2005    (JP)    ............................. 2005-085405

(51) Int. Cl.
*G01P 15/125*    (2006.01)
*G01P 15/00*    (2006.01)

(52) U.S. Cl. ................................. 73/514.32; 73/514.38

(58) Field of Classification Search ............. 73/514.32, 73/514.36, 514.38, 514.16, 514.29
See application file for complete search history.

(56) References Cited

U.S. PATENT DOCUMENTS

| | | | |
|---|---|---|---|
| 5,335,544 A * | 8/1994 | Wagner et al. ........... | 73/514.32 |
| 5,576,250 A | 11/1996 | Diem et al. | |
| 5,780,885 A | 7/1998 | Diem et al. | |
| 6,230,566 B1 * | 5/2001 | Lee et al. .................. | 73/514.32 |
| 6,276,207 B1 * | 8/2001 | Sakai et al. .............. | 73/514.16 |
| 6,543,285 B2 | 4/2003 | Hashimoto ............... | 73/504.14 |
| 6,739,189 B2 * | 5/2004 | Lee et al. ....................... | 73/488 |
| 6,848,310 B2 * | 2/2005 | Goto ........................ | 73/514.32 |
| 6,923,061 B2 * | 8/2005 | Tsubaki .................... | 73/514.32 |
| 6,953,753 B2 * | 10/2005 | Oohara et al. ................ | 438/719 |
| 6,997,054 B2 * | 2/2006 | Tsugai ...................... | 73/504.12 |
| 7,004,026 B2 * | 2/2006 | Kano et al. ............... | 73/514.32 |
| 7,275,435 B2 * | 10/2007 | Sugiura .................... | 73/514.32 |

* cited by examiner

*Primary Examiner*—Helen C. Kwok
(74) *Attorney, Agent, or Firm*—Posz Law Group, PLC

(57) ABSTRACT

An acceleration sensor includes: a semiconductor substrate including a support layer and a semiconductor layer, which are stacked in a first direction; a movable electrode and a fixed electrode; and a trench. The movable electrode separately faces the fixed electrode by sandwiching the trench along with a second direction. The trench has a detection distance in the second direction. The movable electrode is movable along with the first direction when acceleration is applied. The movable electrode has a bottom apart from the support layer. The width of the movable electrode along with the second direction is smaller than the width of the fixed electrode. The thickness of the movable electrode along with the first direction is smaller than the thickness of the fixed electrode.

10 Claims, 7 Drawing Sheets

ACCELERATION SENSOR AND METHOD FOR MANUFACTURING THE SAME

CROSS REFERENCE TO RELATED APPLICATION

This application is based on Japanese Patent Application No. 2005-85405 filed on Mar. 24, 2005, the disclosure of which is incorporated herein by reference.

FIELD OF THE INVENTION

The present invention relates to an acceleration sensor and a method for manufacturing an acceleration sensor.

BACKGROUND OF THE INVENTION

Conventionally, as this sort of acceleration sensors, such an acceleration sensor has been proposed in, for example, JP-A-2003-14778, which corresponds to U.S. Pat. No. 6,739,189-B2. That is, while a semiconductor substrate made by stacking a silicon semiconductor layer on a supporting substrate is prepared, since a trench etching process operation is carried out along a first direction (namely, a vertical direction of substrate plane) perpendicular to a substrate plane of the semiconductor substrate with respect to the silicon semiconductor layer, both a movable electrode and a fixed electrode are patterned and formed on the silicon semiconductor layer along a second direction equal to a parallel direction of the substrate plane, and the movable electrode is located opposite to the fixed electrode with having a detection interval.

Then, when acceleration is applied to this acceleration sensor along the first direction, the movable electrode is displaced along the first direction, and this applied acceleration is detected based upon a capacitance change between the movable electrode and the fixed electrode in conjunction with this displacement.

In other words, the opposite area between the movable electrode and the fixed electrode is changed due to the displacement of the movable electrode along the first direction in conjunction with the application of the acceleration along the first direction. As a result, the capacitance formed between the movable electrode and the fixed electrode is also changed, so that the acceleration can be detected. As previously explained, this sort of acceleration sensor constitutes a vertical displacement type acceleration sensor which detects the acceleration applied along the first direction, namely along the vertical direction of the substrate plane, based upon the displacement of the movable electrode along the same direction.

Furthermore, in this acceleration sensor, lengths of the movable electrode and the fixed electrode opposite to this movable electrode along the vertical direction are different from each other. That is, a thickness of the movable electrode along the first direction is made different from a thickness of the fixed electrode along the first direction.

This condition is caused by the following reason. That is, since the thickness of the movable electrode is different from the thickness of the fixed electrode along the vertical direction of the substrate plane while these electrodes are located opposite to each other along the parallel direction of the substrate plane, changing degrees of the opposite area between the movable electrode and the fixed electrode due to the displacement of the movable electrode when the acceleration is applied along the vertical direction of the substrate plane are different from each other along one direction and the other direction in the vertical direction. As a consequence, the direction of the acceleration applied along the vertical direction of the substrate plane can be properly detected.

If the thickness of the movable electrode is made equal to the thickness of the fixed electrode along the vertical direction of the substrate plane while these electrodes are located opposite to each other along the parallel direction of the substrate plane, then changing degrees of the opposite area between the movable electrode and the fixed electrode due to the displacement of the movable electrode when the acceleration is applied along the vertical direction of the substrate plane are identical to each other along one direction and the other direction in the vertical direction. As a consequence, the direction of the acceleration applied along the vertical direction of the substrate plane cannot be properly detected, so that this sensor structure is not proper as such an acceleration sensor.

On the other hand, as described in JP-A-2003-14778, in this acceleration sensor, the movable electrode and the fixed electrode are patterned by trench-etching the silicon semiconductor layer along the vertical direction of the substrate plane.

Then, the opposite interval between the movable electrode and the fixed electrode is made wider or narrower in this etching process operation. Namely, the width of the removing portion by the etching process operation is made wider or narrower. As a result, the etching rates along the vertical direction of the substrate plane are different from each other in order that the movable electrode and the fixed electrode are patterned, and the thicknesses of the movable electrode and the fixed electrode opposite thereto are made different from each other along the vertical direction of the substrate plane.

However, in the conventional acceleration sensor, when the movable electrode and the fixed electrode are patterned by way of the trench etching process operation, since a difference between the etching rates, namely a so-called "RIE lag" is utilized, reproducibility of the etching process operation is largely fluctuated.

As a result, the resulting thicknesses of the movable electrode and the fixed electrode along the vertical direction of the substrate plane are fluctuated, so that the opposite area between the movable electrode and the fixed electrode is largely fluctuated, and thus, the sensor characteristic is fluctuated, i.e., deviated.

SUMMARY OF THE INVENTION

In view of the above-described problem, it is an object of the present invention to provide an acceleration sensor. It is another object of the present invention to provide a method for manufacturing an acceleration sensor.

An acceleration sensor includes: a semiconductor substrate including a support layer and a semiconductor layer, which are stacked in a first direction perpendicular to the semiconductor substrate; a movable electrode and a fixed electrode disposed in the semiconductor layer; and a trench disposed on the semiconductor layer and reaching the support layer. The movable electrode separately faces the fixed electrode by sandwiching the trench along with a second direction, which is parallel to the semiconductor substrate. The trench has a detection distance in the second direction. The movable electrode is movable along with the first direction when acceleration is applied to the semiconductor substrate along with the first direction so that the acceleration is detected on the basis of capacitance change of a capacitor between the movable electrode and the fixed electrode. The movable electrode has a bottom, which faces the support layer and is apart from the support layer. The movable electrode has a width along with the second direction, and the fixed electrode has a width along with the second direction. The width of the movable electrode is smaller than the width of the fixed electrode. The movable electrode has a thickness along with the first direction, and the fixed electrode has a width along with the first direction. The thickness of the movable electrode is smaller than the thickness of the fixed electrode.

When the above sensor is manufactured, the step of etching the semiconductor layer to form the trench is performed such that the width of the movable electrode is smaller than that of the fixed electrode. Then, the movable electrode is released from the support layer. In general, when the width of the movable electrode is narrow, the side-etching process for side-etching the bottom portion of the movable electrode is finished early. On the other hand, when the width of the movable electrode is wide, the side-etching process time becomes longer. This process time is decided by the dimensions of the movable electrode as an etching object.

Specifically, since the width of the movable electrode is smaller than that of the fixed electrode, the release process time of the movable electrode is shorter than that of the fixed electrode. Thus, the thickness of the movable electrode along with the first direction becomes smaller than that of the fixed electrode.

Accordingly, since the side-etching process is controlled with respect to the widths of the movable and fixed electrodes, the thicknesses of the movable and the fixed electrodes are controlled with small deviation. Thus, the deviation of thickness is improved. Further, manufacturing quality of the sensor is improved.

Alternatively, the fixed electrode may be supported on the support layer so that the fixed electrode contacts the support layer, and the movable electrode may be apart from the support layer at least at a point, at which the detection distance of the trench is defined.

Alternatively, the support layer may include a first silicon layer and an insulation layer. The semiconductor layer provides a second silicon layer, and the first silicon layer, the insulation layer and the second silicon layer are stacked in this order so that the semiconductor substrate provides a SOI substrate.

Alternatively, the movable electrode may have a comb-teeth shape, and the fixed electrode has a comb-teeth shape, and the comb-teeth of the movable electrode are interleaved with the comb-teeth of the fixed electrode so that a distance between one comb-tooth of the movable electrode and a corresponding one comb-tooth of the fixed electrode provides the detection distance.

Alternatively, the bottom of the movable electrode may have a tapered shape or a rounding shape so that a width of the movable electrode becomes smaller as it goes toward the support layer.

Alternatively, the movable electrode may include a first movable portion, a second movable portion, a connection portion, and a spring. The connection portion connects between the first movable portion and the second movable portion. The connection portion is supported on the support layer through the spring. The first movable portion is disposed on an opposite side of the second movable portion through the spring as a center. The first movable portion and the second movable portion are capable of displacing with a see-saw mechanism by the spring so that a movable direction of the first movable portion is opposite to a movable direction of the second movable portion. The first movable portion and the fixed electrode provide a first capacitance, and the second movable portion and the fixed electrode provide a second capacitance. The acceleration is detected on the basis of capacitance change of a difference between the first capacitance and the second capacitance.

Alternatively, the movable electrode may further include a weight portion. The weight portion is disposed on one side of the connection portion, and the weight portion promotes the see-saw mechanism. Further, the movable electrode may further include a capacitance compensation portion, which is disposed on the other side of the connection portion so that the capacitance compensation portion is opposite to the weight portion, and the capacitance compensation portion compensates a capacitance, which is provided by the weight portion.

A method for manufacturing an accelerations sensor includes the steps of: preparing a semiconductor substrate including a support layer and a semiconductor layer, which are stacked in a first direction perpendicular to the semiconductor substrate; etching the semiconductor layer so that a trench is formed on the semiconductor layer, wherein the trench reaches the support layer in order to provide a movable electrode and a fixed electrode disposed in the semiconductor layer, wherein the movable electrode separately faces the fixed electrode by sandwiching the trench along with a second direction, which is parallel to the semiconductor substrate, and wherein the trench has a detection distance in the second direction; and releasing a bottom of the movable electrode from the support layer by side-etching a bottom portion of the movable electrode through the trench. The movable electrode has a width along with the second direction, and the fixed electrode has a width along with the second direction, and the width of the movable electrode is smaller than the width of the fixed electrode.

In the above method, the step of etching the semiconductor layer to form the trench is performed such that the width of the movable electrode is smaller than that of the fixed electrode. Then, the movable electrode is released from the support layer. In general, when the width of the movable electrode is narrow, the side-etching process for side-etching the bottom portion of the movable electrode is finished early. On the other hand, when the width of the movable electrode is wide, the side-etching process time becomes longer. This process time is decided by the dimensions of the movable electrode as an etching object.

Specifically, since the width of the movable electrode is smaller than that of the fixed electrode, the release process time of the movable electrode is shorter than that of the fixed electrode. Thus, the thickness of the movable electrode along with the first direction becomes smaller than that of the fixed electrode.

Accordingly, since the side-etching process is controlled with respect to the widths of the movable and fixed electrodes, the thicknesses of the movable and the fixed electrodes are controlled with small deviation. Thus, the deviation of thickness is improved. Further, manufacturing quality of the sensor is improved.

Thus, the present invention realizes that both a movable electrode and a fixed electrode can be formed under stable condition in a vertical displacement type acceleration sensor. That is, in this vertical displacement type acceleration sensor, both the movable electrode and the fixed electrode are patterned/formed by way a trench etching process operation with respect to a silicon semiconductor layer stacked on a supporting substrate; and when acceleration is applied along a vertical direction of a substrate plane, the applied acceleration is detected based upon a capacitance change between the movable electrode and the fixed electrode.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
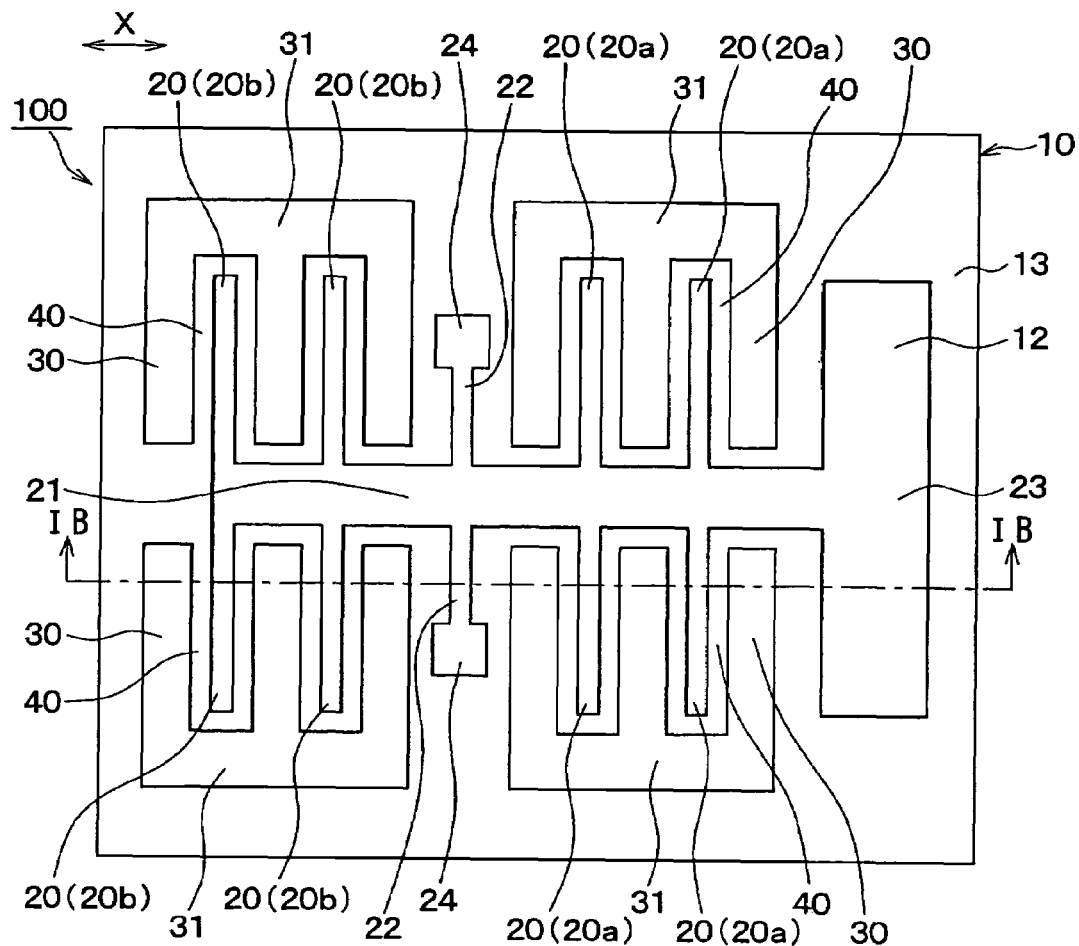
FIG. 1A is a schematic plan view showing an acceleration sensor according to a first embodiment of the present invention.
Figure 1B:
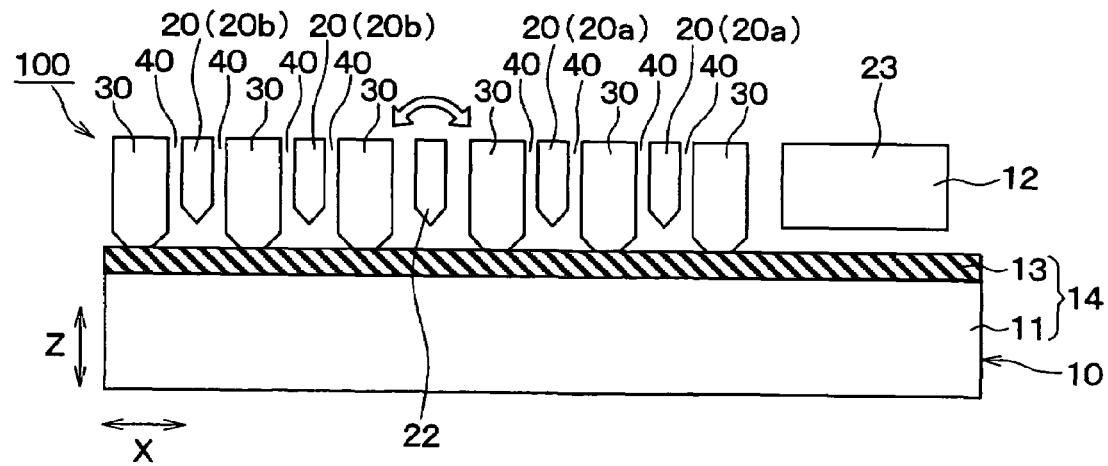
FIG. 1B is a cross sectional view showing the sensor taken along line IB-IB in FIG. 1A.

FIGS. 1A and 1B are diagrams for schematically showing a structure of an acceleration sensor 100 according to a first embodiment of the present invention. Concretely speaking, FIG. 1A is a plan view for schematically indicating the acceleration sensor 100, FIG. 1B is a sectional view for schematically indicating the acceleration sensor 100, taken along a dot/dash line IB-IB FIG. 1A.

(Structure)

As represented in FIG. 1B, the acceleration sensor 100 is provided with a semiconductor substrate 10. The semiconductor substrate 10 is made by stacking a silicon semiconductor layer 12 on a supporting substrate 14.

In this first embodiment, the semiconductor substrate 10 has been manufactured as an SOI (silicon-on-insulator) substrate 10 made by stacking a second silicon semiconductor layer 12 via an insulating layer 13 on a first silicon semiconductor layer 11.

Then, in this semiconductor substrate 10, while both the first silicon semiconductor layer 11 and the insulating layer 13 have been constituted as the supporting substrate 14, the second silicon semiconductor layer 12 has been constituted as the silicon semiconductor layer 12.

In this case, the first silicon semiconductor layer 11 and the second silicon semiconductor layer 12 are made of monocrystal silicon, epitaxial grown polysilicon, or the like. The insulating layer 13 is made of a silicon oxide film, or the like.

Also, as shown in FIG. 1A, a trench 15 has been formed in the second silicon semiconductor layer 12 by trench-etching with respect to the second silicon semiconductor layer 12 along a first direction "Z" which is located perpendicular to the substrate plane of the semiconductor substrate 10.

Then, both a movable electrode 20 and a fixed electrode 30 have been patterned and formed on the second silicon semiconductor layer 12. The movable electrode 20 and the fixed electrode 30 are segmented by this trench 15. The fixed electrode 30 is located opposite to the movable electrode 20, and owns a detection interval 40 along a second direction "X" which is located parallel to the substrate plane of the semiconductor substrate 10.

It should be understood that the above-described substrate plane of the semiconductor substrate 10 corresponds to either a major plane of the semiconductor substrate 10 or a plane parallel to the major plane, namely, corresponds to a paper surface as viewed in FIG. 1A. More specifically, the first direction "Z" is equal to a so-called "vertical direction of substrate plane", namely a thickness direction of the substrate 10, whereas the second direction "X" is equal to a so-called "parallel direction of substrate plane", namely a direction perpendicular to the thickness direction of the substrate 10.

In this first embodiment as indicated in FIG. 1A, while the movable electrode 20 and the fixed electrode 30 have comb teeth shapes in such a manner that the movable electrode 20 is meshed with the fixed electrode 30, a gap between the movable electrode 20 and the fixed electrode 30 in this comb teeth is formed as a detection interval 40.

Then, in this detection interval 40, the movable electrode 20 is separated from the supporting substrate 14, namely the insulating layer 13, and the fixed electrode 30 is supported by the supporting substrate 14, namely supported by being contacted to the insulating layer 13.

Concretely speaking, the movable electrode 20 is manufactured by that a plurality of movable electrodes 20a and 20b are arranged in the comb teeth shape. Then, as shown in FIG. 1A, a plurality of movable electrodes 20 have been coupled to each other by a coupling portion 21 in an integral body. In this case, the coupling portion 21 owns a pillar shape which is elongated along the array direction of these movable electrodes 20. Similar to the movable electrodes 20, this coupling portion 21 is separated from the supporting substrate 14.

Then, this coupling portion 21 has been supported via a beam portion 22 having a spring characteristic with respect to the supporting substrate 14. Similar to the movable electrodes 20, this beam portion 22 is also separated from the supporting substrate 14, but a portion of the beam portion 22 has been supported via an anchor portion 24 by the supporting substrate 14.

In this example, one edge portion of the beam portion 21 has been coupled to an intermediate portion of the pillar-shaped coupling portion 21 in an integral body, and the other edge portion thereof has been supported via the anchor portion 24 by the supporting substrate 14. Similar to the fixed electrode 30, the anchor portion 24 corresponds to such a portion of the second silicon layer 12, which is contacted and fixed to the supporting substrate 14.

In this case, it is so assumed that such a movable electrode which is located on one side (right side as viewed in FIGS. 1A and 1B) of the beam portion 22 while the beam portion 22 is located at a center is referred to as a first movable electrode 20a, whereas another movable electrode which is located on the other side (left side as viewed in FIGS. 1A and 1B) of the beam portion 22 is referred to as a second movable electrode 20b among these plural movable electrodes 20.

Furthermore, a weight portion 23 has been provided on an edge portion of the coupling portion 21 on the side of the first movable electrode 20a in an integral body, while the beam portion 22 is locate data center. The weight portion 23 is to displace the movable electrodes 20. Similar to the movable electrodes 20, this weight portion 23 is separated from the supporting substrate 14.

In other words, the movable electrodes 20, the coupling portion 21, the beam portion 22, and the weight portion 23 have been formed in an integral body. The respective components 20 to 23 formed in the integral body have been constituted as movable structural members 20 to 23 which have been segmented and formed in the second silicon semiconductor layer 12 by the above-explained trench 15.

As explained above, the movable structural members 20 to 23 which are connected to the anchor portion 24 at the beam portion 22 released from the supporting substrate 14 via the anchor portion 24 may be formed as follows:

That is, after patterns of the movable structural members 20 to 23 have been formed via the trench 15 formed by the trench etching process, bottom portions of the movable structural members 20 to 23 which contain the movable electrodes 20 on the side of the supporting substrate 14 are side-etched. These etching process operations will be explained in detail later.

It should also be understood that as to also the fixed electrodes 30, in this first embodiment, although bottom portions of these fixed electrodes 30 on the side of the supporting substrate 14 are side-etched, the side-etching process operation is accomplished before the fixed electrodes 30 are released from the supporting substrate 14. As a result, as shown in FIG. 1B, the fixed electrodes 30 are supported by the supporting substrate 14 by being contacted to this supporting substrate 14.

Also, as indicated in FIG. 1B, in this first embodiment, the bottom portions of the movable electrodes 20 on the side of the supporting substrate 14 have been formed in a taper shape in such a manner that these bottom portions are narrowed toward the supporting substrate 14. Such a taper shape of the movable electrode 20 can be formed by way of a side etching process operation (will be discussed later).

It should also be noted that the bottom portions of the fixed electrodes 30 which are contacted to the supporting substrate 14 have been made in a taper shape. Alternatively, such a bottom portion of the movable electrode 20 may be formed in the above-explained taper shape having an acute angle. Also, this bottom portion may be formed in a curved plane shape in such a manner that this bottom portion becomes a convex shape toward the supporting substrate 14, namely a round shape.

Then, a plurality of these movable electrodes 20 released from the supporting substrate 14 are displaceable as the entire movable structural members 20 to 23 as indicated by double arrows shown in FIG. 1B due to the spring characteristic of the beam portion 22.

In other words, when acceleration is applied to the movable electrodes 20 along the first direction "Z", the movable electrodes 20 can be displaced along this first direction "Z". Then, opposite areas between the movable electrodes 20 and the fixed electrodes 30 which are positioned opposite to the movable electrodes 20 in the detection intervals 40 are changed due to this displacement.

More concretely speaking, in the first embodiment, one edge of the coupling portion 21 and the other edge thereof are displaced along opposite direction along the first direction "Z." In other words, such a seesaw-shaped displacement is made in such a way that the first movable electrode 20a and the second movable electrode 20b are displaced with each other along the opposite direction. It should also be noted that the beam portion 22 may merely own such a spring characteristic that the beam portion 22 is displaced in the seesaw shape, and the shape of this beam portion 22 is not limited only to a specific shape.

Now, in the acceleration sensor 100 of the first embodiment, as shown in FIG. 1B, a width of the movable electrode 20 along the second direction "X" is made narrower than a width of the fixed electrode 30 along the second direction "X", and a thickness of the movable electrode 20 along the first direction "Z" is made thinner than a thickness of the fixed electrode 30 along the first direction "Z".

That is to say, in this first embodiment, when the widths (namely, widths of electrodes) along the second direction "X" corresponding to the parallel direction of the substrate plane are viewed, the width of the movable electrode 20 is made narrower than the width of the fixed electrode 30, whereas the thicknesses along the first direction "Z", namely the thicknesses of the electrodes along the vertical direction of the substrate plane are viewed, the thickness of the movable electrode 20 is made thinner the thickness of the fixed electrode 30.

Also, in the first embodiment, there are also plural pieces of the fixed electrodes 30 in correspondence with the plural pieces of the movable electrodes 20. As indicated in FIG. 1A, the respective fixed electrodes 30 are combined with each other by the coupling portion 21 for the fixed electrodes for every the first movable electrode 20a and the second movable electrodes 20b, or on the upper side and the lower side of the coupling portion 21.

Although not shown in the drawing, wiring line portions are derived from the coupling portion 21 for the fixed electrodes and the movable structural members 20 to 23. These wiring line portions are electrically connected to external unit via pads which are provided at proper positions of the wiring line portions. For example, since a wire bounding treatment is performed on these pads, the acceleration sensor 100 may be electrically conducted to an external circuit.

(Operations)

Next, a description is made of operations as to the acceleration sensor 100 according to the first embodiment.

Figure 2:
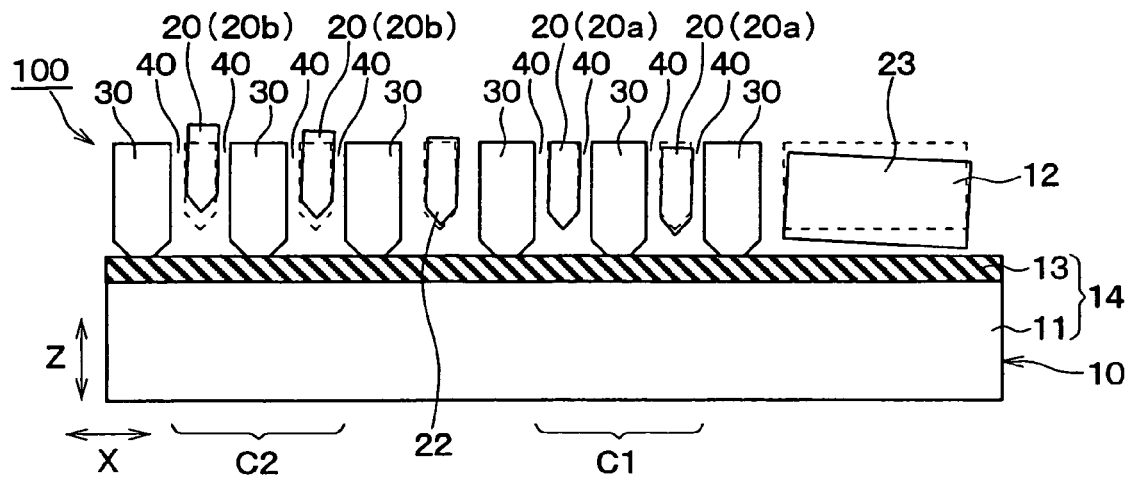
FIG. 2 is a cross sectional view explaining a displacement of a movable electrode under acceleration along with a first direction, according to the first embodiment.

FIG. 2 is a sectional view for schematically showing displacement conditions of the movable electrodes 20 when acceleration is applied to this acceleration sensor 100 along the first direction "Z". It should also be understood that a broken line shown in FIG. 2 represents such a condition obtained before the movable electrodes 20 are displaced, namely, such a condition that acceleration is "0".

The acceleration sensor 100 of this first embodiment basically detects acceleration as follows: That is, when acceleration is applied along the first direction "Z" to this acceleration sensor 100, the movable electrode 20 is displaced along the first direction "Z", and then the applied acceleration is detected based upon a capacitance change between the movable electrode 20 and the fixed electrode 30 in conjunction with this displacement.

As previously explained, in this first embodiment, when the above-described acceleration is applied, the seesaw-shaped displacement is made in such a way that the first movable electrode 20a and the second movable electrode 20b are displaced in the opposite directions along the first direction "Z" due to the spring characteristic of the beam portion 22.

FIG. 2 indicates such a condition that acceleration is applied upwardly along the first direction "Z", so that the position of the weight portion 23 is lowered, as compared with the position where the acceleration becomes 0, i.e., zero. In other words, FIG. 2 shows such a condition that while the beam portion 22 is defined as a reference, the first movable electrode 20a is approached close to the supporting substrate 14, and the second movable electrode 20b is separated apart from the supporting substrate 14. This condition will be referred to as a "lower displacement condition of weight" hereinafter.

Apparently, contrary to the condition shown in FIG. 2, when acceleration is applied downwardly along the first direction "Z", the position of the weight portion 23 is increased, as compared with the position whereas the acceleration becomes 0. That is to say, FIG. 2 shows such a condition that while the beam portion 22 is defined as the reference, the first movable electrode 20a is separated apart from the supporting substrate 14, and the second movable electrode 20b is approached close to the supporting substrate 14. This condition will be referred to as an "upper displacement condition of weight" hereinafter.

In this example, as shown in FIG. 2, a capacitance formed between the first movable electrode 20a and the fixed electrode 30 in the detection interval 15 is assumed as a first capacitance "C1", whereas a capacitance formed between the second movable electrode 20b and the fixed electrode 30 in the detection interval 15 is assumed as a second capacitance "C2."

As previously explained, when the acceleration is applied along the first direction "Z", the movable electrode 20 is displaced along this first direction "Z", so that the opposite area between the movable electrode 20 and the fixed electrode 30 is changed in the detection interval 15. In connection with this displacement, the above-explained first capacitance C1 and second capacitance C2 are changed. This capacitance change will be described in a concrete manner with reference to FIG. 3.

Figure 3:
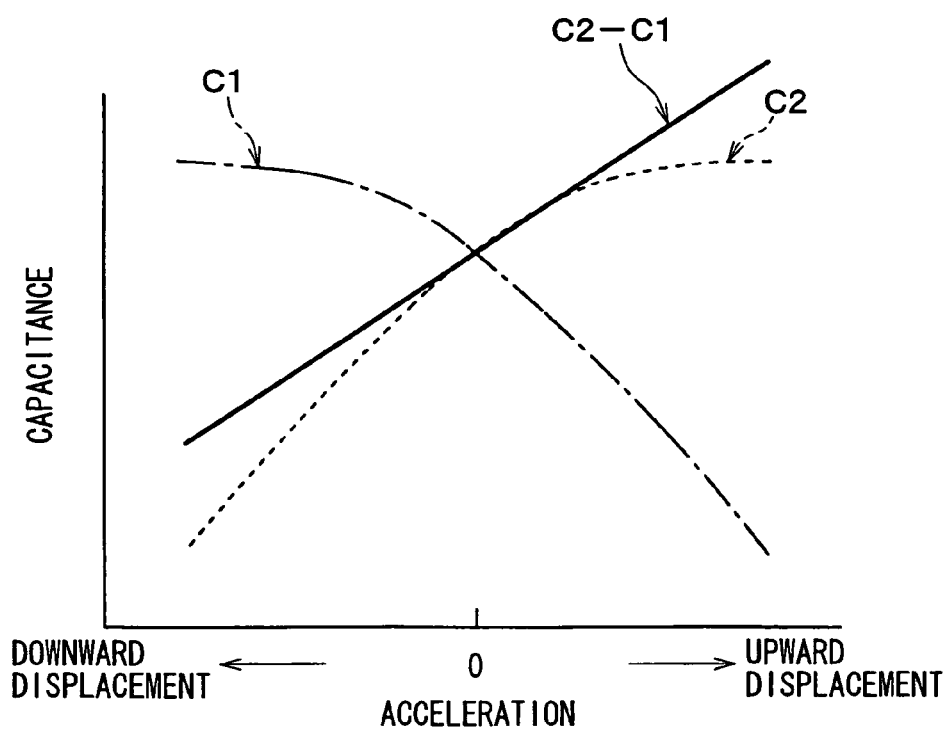
FIG. 3 is a graph showing a relationship between the acceleration and capacitance, according to the first embodiment.

FIG. 3 is a diagram for indicating a relationship between acceleration and a capacitance change caused by displacement of the movable electrode 20. In FIG. 3, an abscissa shows the acceleration and an ordinate indicates the capacitance.

In this graphic representation, while the acceleration=0, i.e., zero acceleration, is indicated at a center, a left side shown in FIG. 3 corresponds to a direction of acceleration which constitutes "lower displacement condition of weight", namely corresponds to acceleration applied upwardly along the first direction "Z" shown in FIG. 2, whereas a right side shown in FIG. 3 corresponds to a direction of acceleration which constitutes "upper displacement condition of weight", namely corresponds to acceleration applied downwardly along the first direction "Z" shown in FIG. 2.

Then, as represented in FIG. 3, as to magnitudes of the acceleration, the further the acceleration is separated from "0" to the left side, the larger the magnitude of downward acceleration is increased, whereas the further the acceleration is separated from "0" to the right side, the larger the magnitude of upward acceleration is increased.

As indicated in FIG. 3, in this first embodiment, the respective capacitances C1 and C2 are changed in a non-linear mode in conjunction with the displacement of the movable electrode 20. The major reason why the capacitances C1 and C2 are non-linearly changed is given as follows: That is, as to thicknesses of electrodes along the first direction "Z", since the thickness of the movable electrode 20 is made thinner than the thickness of the fixed electrode 30, even when the movable electrode 20 is displaced along the approaching direction to the supporting substrate 14, the opposite area between these movable and fixed electrodes 20, 30 is not so largely changed, whereas when the movable electrode 20 is displaced along the separating direction from the supporting substrate 14, the opposite area is decreased.

Then, the acceleration sensor 100 of this first embodiment detects acceleration based upon a change in capacitance difference (C2−C1) of the first and second capacitances C1 and C2 in conjunction with the displacement of the movable electrode 20.

As indicated in FIG. 3, although the respective first and second capacitances C1 and C2 are changed in the non-linear mode, the capacitance difference (C2−C1) owns a substantially linear characteristic. As a consequence, in the first embodiment, since this capacitance difference (C2−C) is measured, the sensitivity having the superior linearity can be obtained. The above-described operations correspond to the acceleration detecting operations by the acceleration sensor 100 according to the first embodiment.

(Manufacturing Method)

Next, a method of manufacturing the acceleration sensor 100 according to the first embodiment will now be described with reference to FIGS. 4A to 4E, and FIGS. 5A to 5C. FIGS. 4A to 4E are sectional views for indicating trench forming steps executed in this manufacturing method. FIGS. 5A to 5C are sectional views for showing release steps performed in this manufacturing method.

Firstly, a semiconductor substrate 10 is prepared which is made by stacking a silicon semiconductor layer 12 on a supporting substrate 14. In the first embodiment, as the semiconductor substrate 10, such an SOI substrate 10 is prepared. That is, in this SOI substrate 10, while a second silicon semiconductor layer 12 has been stacked via an insulating layer 13 on the first silicon semiconductor layer 11, both the first silicon semiconductor layer 11 and an insulating layer 13 have been constituted as a supporting substrate 14, and the second silicon semiconductor layer 12 has been constituted as a silicon semiconductor layer.

Figure 4A:
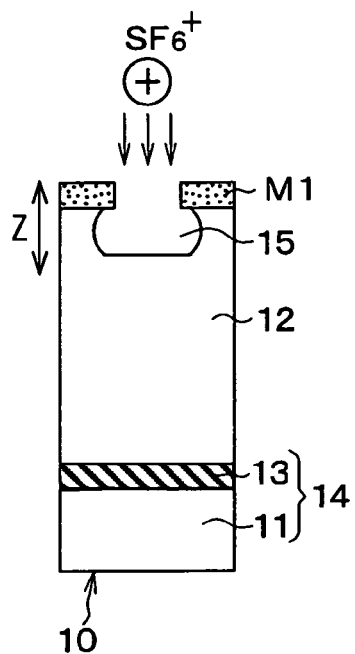
FIGS. 4A to 4E are cross sectional views explaining a trench forming step in a method for manufacturing the acceleration sensor according to the first embodiment.
Figure 5A:
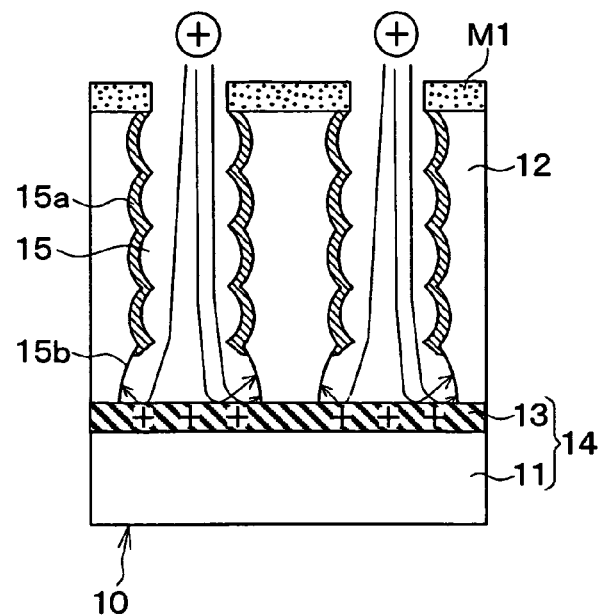
FIGS. 5A to 5C are cross sectional views explaining a releasing step in the method for manufacturing the acceleration sensor according to the first embodiment.
Figure 5B:
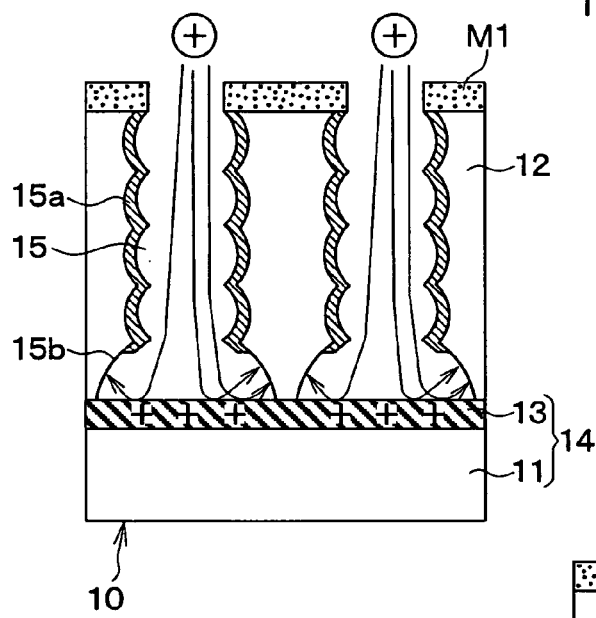
Figure 5C:
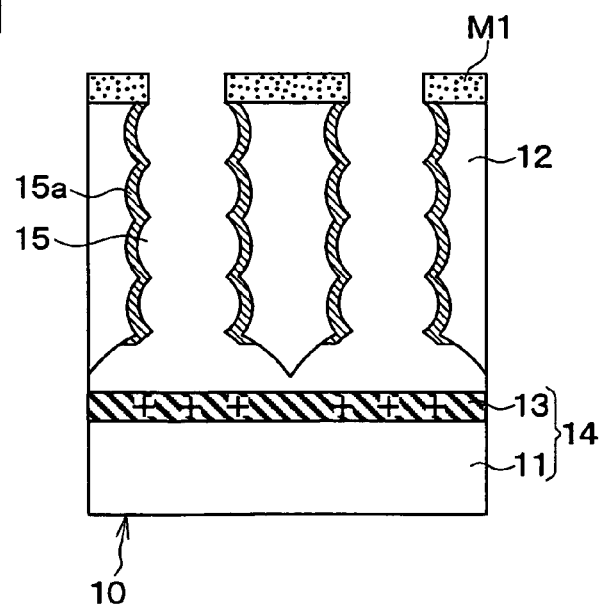

Next, as shown in FIG. 4A, a mask M1 having a predetermined pattern is formed on the surface side of the second silicon semiconductor layer 12 (mask forming step). This mask M1 may be formed by employing a resist material made of a photo-curing type resin, or a thermosetting type resin, while a photolithographic technique and the like are utilized.

Then, this mask M1 is formed as such a mask M1 with a pattern having an opening portion at a portion which constitutes the above-described trench 15. In other words, the portions of the second silicon semiconductor layer 12 which are masked by the mask M1 constitute patterns of the movable structural members 20 to 23, the anchor portion 24, and the fixed electrode 30.

Both a trench forming step and a release step which are subsequently carried out will be performed as follows: That is, the SOI substrate 10 is set in a vacuum chamber, reactive gas is conducted to the vacuum chamber, and an reactive ion etching (RIE) process operation is carried out under such a condition that the conducted reactive gas is changed in a plasma state. Moreover, a step for forming a side wall protection film is performed on the side wall of the trench 15 in order to protect this side wall at the same time, or at different timing when the RIE etching process is carried out.

The trench forming steps shown in FIGS. 4A to 4E are carried out by alternately repeating an etching step and a protection film forming step in a switching manner. In the etching step, the second silicon semiconductor layer 12 is etched by a plasma of etching treatment gas. In the protection film forming step, the side wall protection film 15a is formed by a plasma of depositing treatment gas.

Firstly, in FIG. 4A, a first etching step is indicated. First of all, the SOI substrate 10 where the above-described mask M1 has been formed is set in the vacuum chamber. Then, $SF_6$ gas is conducted into the vacuum chamber for a predetermined time (for example, approximately 7 seconds) so as to perform a silicon etching process operation as the etching treatment gas.

As a result, the second silicon semiconductor layer 12 is etched, so that such a trench 15 which is reached from the surface of the second silicon semiconductor layer 12 to the insulating layer 13 is partially formed. At this time, the $SF_6$ gas becomes a plasma state in the electric field which may contribute the etching process operation. In FIG. 4A, this $SF_6$ gas is indicated in the form of a plus ion.

Then, since bias electric power is applied to the SOI substrate 10, this plus ion is attracted to the direction of the SOI substrate 10, and an isotropic trench etching operation is carried out along the first direction "Z" perpendicular to the substrate plane of the SOI substrate 10.

Figure 4B:
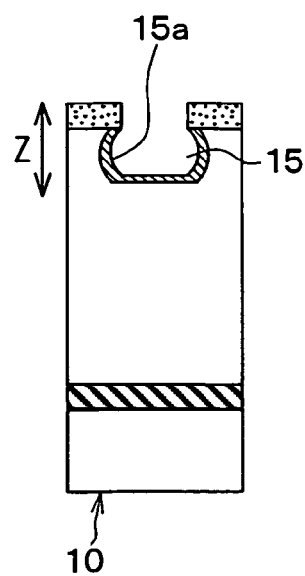

Next, as shown in FIG. 4B, a first protection film forming step is performed. That is, the conduction of the $SF_6$ gas functioning as the etching treatment gas is stopped, and $C_4F_8$ gas is conducted into the vacuum chamber as depositing treatment gas for a predetermined time (for example, approximate 5 seconds).

In this protection film forming step, bias electric power is not supplied to the SOI substrate 10. As a result, a side wall protection film 15a is uniformly formed on both the side wall and the bottom wall of the trench 15. In this case, in such a case that fluorine series gas such as $C_4F_8$ gas is employed, the side wall protection film 15a is made of polymer fluoride.

Figure 4C:
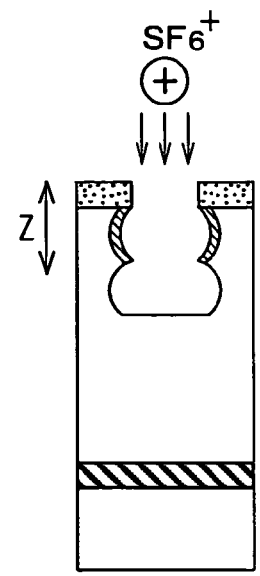
Figure 4D:
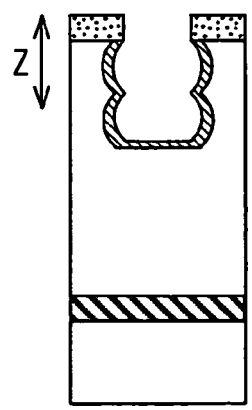

Subsequently, as indicated in FIG. 4C and FIG. 4D, the etching step and the protection film forming step are switched and are alternately repeated. In this case, an etching depth made by one etching step may be made in, for instance, about 0.1 to 0.5 μm.

Figure 4E:
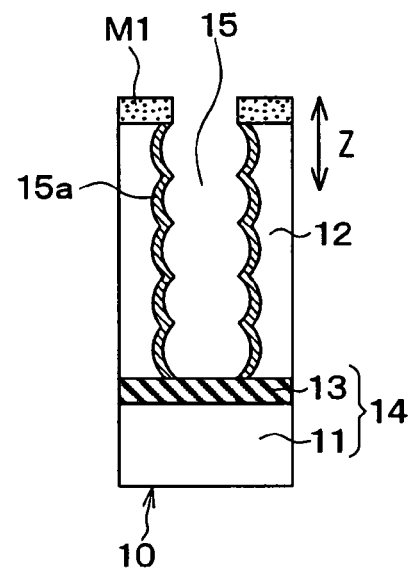

Then, finally, as indicated in FIG. 4E, forming of a trench 15 is accomplished which is reached from the surface of the second silicon semiconductor layer 12 to the insulating layer 13. The above-explained forming steps correspond to the trench forming step.

As previously described, in the trench forming step, the trench etching process operation is performed with respect to the second silicon semiconductor layer 12 along the first direction "Z" perpendicular to the substrate plane of the SOI substrate 10 in order that the patterns of the movable structural members 20 to 23 containing the movable electrode 20, the anchor portion 24, and the fixed electrode 30 are formed on the second silicon semiconductor layer 12.

The above-explained forming steps are a summary of the trench forming step according to this first embodiment. In this case, in the first embodiment, the pattern of the movable electrode 20 and the pattern of the fixed electrode 30 are formed in such a manner that the electrode width of the movable electrode 20 along the second direction "X" is made narrower than the electrode width of the fixed electrode 30 along the second direction "X".

This width forming condition may be easily realized by the mask pattern of the mask M1 in the above-explained mask forming step. Then, after the trench forming step has been carried out in the above-described manner, the release step indicated in FIG. 5 is subsequently carried out.

This release step may be carried out by continuing an etching process operation, for example, under the same etching condition as that of the above-explained trench forming step. In other words, even in this first embodiment, the release step may be carried out by repeating the above-explained etching step and protection film forming step.

As indicated in FIG. 5A, the insulating layer 13 made of a silicon oxide film in this example has been charged to a plus state by plus ions of etching treatment gas. The etching treatment gas is continuously conducted after the trench 15 has been formed.

Under such a condition, a plus ion of etching treatment gas is furthermore conducted. As represented in FIG. 5A, this plus ion is repelled from the insulating layer 13 which has been charged to the plus state, and thus, is dispersed along the lateral directions at the bottom portion of the trench 15.

As a result, as indicated in FIG. 5A, the bottom portion of the second silicon semiconductor layer 12 on the side of the supporting substrate 14 is etched along the lateral direction at the bottom portion of the trench 15, namely this bottom portion is side-etched, so that a notch 15b is formed in the second silicon semiconductor layer 12.

In the etching process operation along the lateral direction, namely in the side etching process operation, the etching treatment gas etches the second silicon semiconductor layer 12, while the side wall protection film 15a formed in the protection film forming step is removed by way of either an etching process operation or a physical sputtering process operation.

Then, since this side etching process operation is continuously performed, as indicated in FIG. 5B, the notch 15b is enlarged. Thereafter, as shown in FIG. 5C, the movable structural members 20 to 23 are made as the portions where the second silicon semiconductor layer 12 is released from the insulating layer 13.

In the example shown in FIG. 5C, two notches 15b are communicated with each other, and a portion of the shape of the notch 15b is left on the bottom portion of the movable electrode 20, so that the bottom of the movable electrode 20 having the above-explained taper shape can be realized.

In this case, in the first embodiment, when the side etching process operation is carried out, the electrode width of the movable electrode 20 is made narrower than the electrode width of the fixed electrode 30, so that releasing of the movable electrode 20 having the narrower electrode width can be completed from the supporting substrate 14 as the bed faster than the fixed electrode 30 having the wider electrode width.

As a consequence, before the fixed electrode 30 is released from the supporting substrate 14, and when the bottom portion of the movable electrode 20 on the side of the supporting substrate 14 becomes the above-described taper shape, the side etching process operation can be accomplished. Then, as a result, the electrode thickness of the movable electrode 20 along the first direction "Z" may be made thinner than the electrode thickness of the fixed electrode 30.

As previously explained, in the release step, both the bottom portion of the movable electrode 20 and the bottom portion of the fixed electrode 30 on the side of the supporting substrate 14 are side-etched via the trench 15 formed in the trench etching process operation in order that the movable electrode 20 is released from the supporting substrate 14. As a result, the acceleration sensor 100 according to this first embodiment is completed in the above-described manner.

(Effects)

As previously described, the acceleration sensor 100, according to the first embodiment, is featured by having the below-mentioned basic structure. That is to say, a vertical displacement type acceleration sensor corresponding to this acceleration sensor 100 is provided with the semiconductor substrate 10 made by stacking the silicon semiconductor layer 12 on the supporting substrate 14; the trench etching process operation is carried out with respect to the silicon semiconductor layer 12 along the first direction "Z" perpendicular to the substrate plane of the semiconductor substrate 10; the movable electrode 20 and the fixed electrode 30 are patterned on the silicon semiconductor layer 12 in such a manner that the fixed electrode 30 is located opposite to the movable electrode 20 along the second direction "X" parallel to the substrate plane of the semiconductor substrate 10, while having the detection interval 40; when the acceleration is applied to this acceleration sensor 100 along the first direction "Z", the movable electrode 20 is displaced along the first direction "Z"; and then, the applied acceleration is detected based upon the capacitance change produced between the movable electrode 20 and the fixed electrode 30 in conjunction with this displacement.

Then, the above-described acceleration sensor 100 having such a basic structure owns the below-mentioned specific features:

The movable electrode 20 has been released from the supporting substrate 14 by side-etching the bottom portion of the movable electrode 20 and the bottom portion of the supporting electrode 30 on the side of the supporting substrate 14 via the trench 15 formed by the trench etching process operation.

The width of the movable electrode 20 along the second direction "X" is made narrower than the width of the fixed electrode 30 along the second direction "X", whereas the thickness of the movable electrode 20 along the first direction "Z" is made thinner than the thickness of the fixed electrode 30 along the first direction "Z". In accordance with the first embodiment, the vertical displacement type acceleration sensor 100 having such feature points may be provided.

As previously explained, in the conventional acceleration sensor, the RIE lag is utilized when the movable electrode and the fixed electrode are patterned by the trench etching process operation, so that the thicknesses of the movable electrode and the fixed electrode along the vertical direction of the substrate plane are fluctuated, i.e., deviated.

To the contrary, in this fist embodiment, the widths of the portions which are left by the etching process operation are changed with respect to the movable electrode 20 and the fixed electrode 30. As a result, the movable electrode 20 and the fixed electrode 30 are patterned by the trench etching process operation, and subsequently, the movable electrode 20 can be released by the side etching process operation.

In the etching process operation, if the width of the above-described remaining portion is narrow, then the side etching process operation for the bottom portion in order to release the remaining portion from the bed can be accomplished earlier. To the contrary, if the width of the remaining portion is wide, the completion of the side etching process operation of this bottom portion is delayed. This etching effect is determined based upon physical dimensions of the subjects to be etched, so that the control characteristic becomes superior than that in the case that the difference in the etching rates, the so-called "RIE lag" is utilized.

In other words, as previously explained, in this first embodiment, both the movable electrode 20 and the fixed electrode 30 are patterned by the trench etching process operation in such a manner that the width of the movable electrode 20 along the second direction "X", namely, along the parallel direction of the substrate plane is made narrower than the width of the fixed electrode 30. Subsequently, the side etching process operations are carried out with respect to the bottom portions of both the electrodes 20 and 30 so as to release the movable electrode 20.

Then, when this side etching process operation is carried out, since the width of the movable electrode 20 becomes narrower than the width of the fixed electrode 30 as the remaining portion, the releasing operation as to the movable electrode 20 having the narrower width from the supporting substrate 14 as the bed can be completed faster than the fixed electrode 30 having the wider width. As a result, the thickness of the movable electrode 20 along the first direction "Z", namely along the vertical direction of the substrate plane can be made thinner than the thickness of the fixed electrode 30 along the first direction "Z."

As previously explained, in this first embodiment, the effects of this side etching process operation are controlled by the width of the remaining portion. As a result, such a structure that the thickness of the movable electrode 20 is different from the thickness of the fixed electrode 30 along the first direction "Z", namely, the vertical direction of the substrate plane may be realized under stable condition, while a fluctuation of reproducibility is reduced.

As a consequence, in accordance with this first embodiment, in the vertical displacement type acceleration sensor 100, both the movable electrode 20 and the fixed electrode 30 can be manufactured under stable structures. In this vertical displacement type acceleration sensor 100, both the movable electrode 20 and the fixed electrode 30 are patterned and formed by trench etching process operation of the silicon semiconductor layer 12 stacked on the supporting substrate 14, and when the acceleration is applied along the vertical direction of the substrate plane, the applied acceleration is detected based upon the capacitance change produced between the movable electrode 20 and the fixed electrode 30.

Now, a concrete description is made of high precision control operation as to the electrode thicknesses of the movable electrode 20 and the fixed electrode 30 by changing the widths of the movable electrode 20 and the fixed electrode 30 as the remaining portions by performing the trench etching process operation, and subsequently by performing the side etching process operation.

Figure 6:
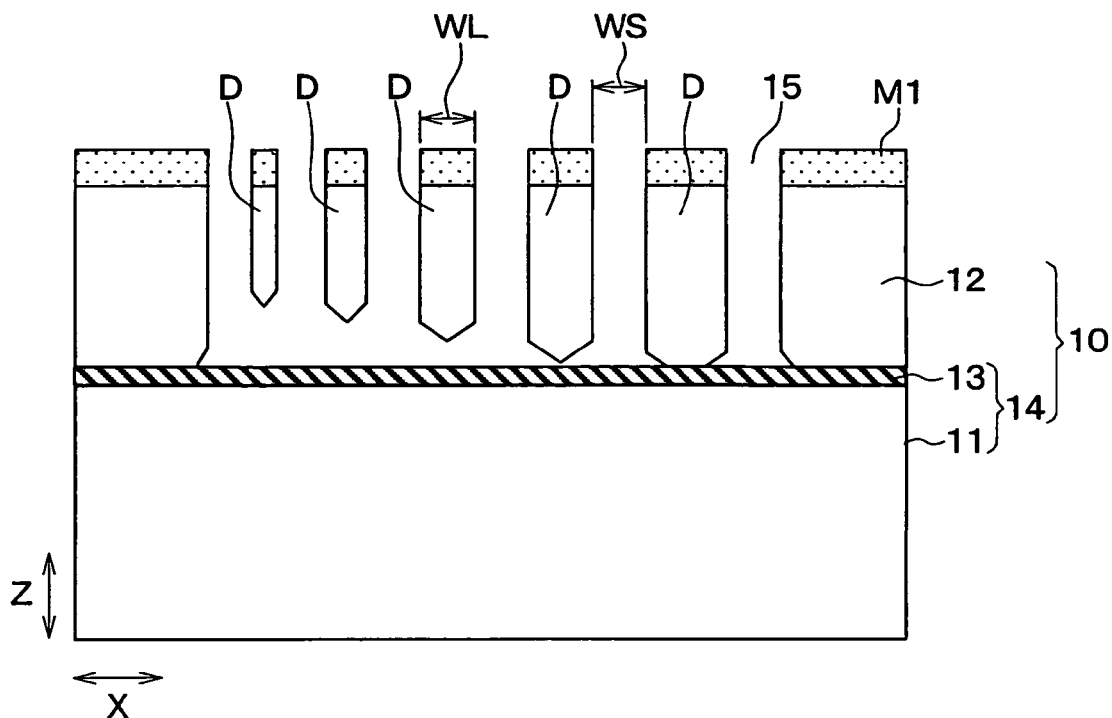
FIG. 6 is a cross sectional view showing an electrode construction having multiple different electrodes, according to the first embodiment.

FIG. 6 is a sectional view for schematically showing such a structure that a plurality of electrode structural members "D" have been arrayed via trenches 15, while widths and thicknesses of these electrodes are different from each other. In FIG. 6, each of the electrode structural members "D" corresponds to the movable electrode 20, or the fixed electrode 30 provided in the acceleration sensor 100.

Then, in FIG. 6, while electrode intervals "WS" between the adjoining electrode structural members "D" along the second direction "X" are made constant, electrode widths "WL" in the respective electrode structural members "D" along the second direction "X" are gradually made wider from the left-sided electrode structural member to the right-sided electrode structural member along the second direction "X".

Then, the structure shown in FIG. 6 may be obtained by performing the following process operations. That is, since a trench etching process operation similar to the above-described manufacturing method is carried out, patterns of these plural electrode structural members "D" having the different electrode widths "WL" are formed, and thereafter, a side etching process operation is carried out via the trenches 15 similar to the above-explained trenches.

As represented in FIG. 6, when this side etching process operation is carried out, the narrower an electrode width of an electrode structural member among the plural electrode structural members "D" becomes, the faster releasing of this electrode structural member from the supporting substrate 14 is accomplished. As a result, an electrode thickness of this electrode structural member along the first direction "Z" is made thinner. In FIG. 6, distances between bottom portions of the electrode structural members "D" and the supporting substrate 14 are indicated as gaps "h". The narrower the electrode width of the electrode structural member "D" becomes, the higher this gap "h" becomes.

Then, while using the above-described gap "h" which reflects the electrode thickness of this electrode structural member "D", a relationship between the gap "h" and the above-explained electrode width "WL" when the electrode interval "WS" is made constant was investigated. The investigation result is indicated in FIG. 7.

Figure 7:
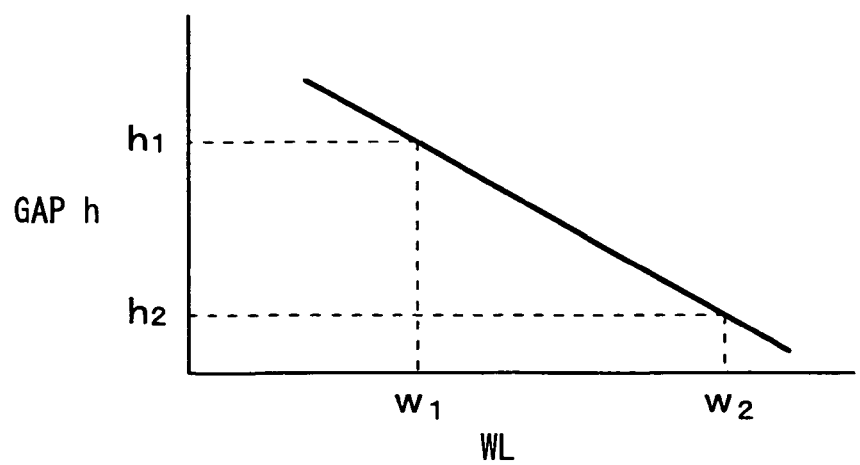
FIG. 7 is a graph showing a relationship between an electrode width and a gap under constant electrode interval, according to the first embodiment.

As indicated in FIG. 7, when the electrode width "WL" is increased while the electrode interval "WS" is made constant, it could be confirmed that the gap "h" is decreased in a monotone manner. Conversely speaking, when the electrode width "WL" is increased while the electrode interval "WS" is made constant, it can be understood that there is such a trend that the electrode thickness is increased in a monotone manner.

In other words, it is possible to grasp that the relationship between the electrode width "WL" and the gap "h", namely the relationship between the electrode width "WL" and the electrode thickness is a direct proportional relationship in a substantially linear manner. Therefore, if the electrode width "WL" is changed in the movable electrode 20, then it is easy to realize a target electrode thickness by performing the side etching process operation.

For instance, in FIG. 7, assuming now that a movable electrode having an electrode width "W1" and another movable electrode having an electrode width "W2" are provided, and the electrode width "W2" is wider than the electrode width "W1", as to the gap "h" after the side etching process operation, the former movable electrode owns a gap "h1" whereas the later movable electrode owns a gap "h2" which is larger than the gap "h1." A step difference of these gaps on the side of the button portions becomes (h2–h1). If this relationship is applied to the movable electrode 20 and the fixed electrode 30, then the electrode thicknesses of both the movable electrode 20 and the fixed electrode 30 can be made as desirable thicknesses by adjusting the electrode widths "WL" of both the electrodes 20 and 30.

As previously explained, since the electrode widths are controlled by the side etching process operation by changing the electrode widths of the movable electrode 20 and the fixed electrode 30, the superior reproducibility can be realized and the fluctuation can be reduced, as compared with such a case that the electrode thicknesses are controlled by changing the electrode intervals and using the RIE lags as explained in the prior art.

Also, the acceleration sensor 100 of the first embodiment owns another feature. That is, in the detection interval 40, the movable electrode 20 is separated from the supporting substrate 14, whereas the fixed electrode 30 is supported in contact with the supporting substrate 14.

Also, as one of the features, in the acceleration sensor 100 of the first embodiment, as the semiconductor substrate 10, the SOI substrate 10 is employed. This SOI substrate 10 is made by stacking the second silicon semiconductor layer 12 functioning as the silicon semiconductor layer on the supporting substrate 14 which is manufactured by stacking the insulating layer 13 on the first silicon semiconductor layer 11.

Also, as one of the features of this first embodiment, both the movable electrode 20 and the fixed electrode 30 own the comb teeth shapes in such a manner that the movable electrode 20 is meshed with the fixed electrode 30, and the gaps in the comb teeth are constituted as the detection interval 40.

Furthermore, in the acceleration sensor 100 of this first embodiment, one of the features thereof is given as follows: That is, the bottom portion of the movable electrode 20 on the side of the supporting substrate 14 is formed in either the taper shape or the round shape in such a manner that the bottom portion is narrowed toward the supporting substrate 14.

When the movable electrode 20 is displaced along the first direction "Z", there are some possibilities that dumping may occur between the movable electrode 20 and the supporting substrate 14 as the bed thereof. If the structure is made in this manner, then air flows of the bottom portion of the movable electrode 20 can be improved and the air resistance value can be decreased, so that the dumping can be properly suppressed. As a result, even when acceleration in a high frequency range is applied, there is a merit that a sufficiently high sensitivity can be secured.

Also, when excessively large shock is applied, there are some possibilities that the movable electrode 20 is largely displaced along the first direction "Z", and thus, the bottom portion of the movable electrode 20 is made in contact to the supporting substrate 14 and then, is adhered to the supporting substrate 14, a so-called "sticking" phenomenon occurs. However, since the opposite area of the bottom portion of the movable electrode 20 located opposite to the supporting substrate 14 can be made small, such a sticking phenomenon can be suppressed as being permitted as possible, resulting in a preferable effect.

Furthermore, in this first embodiment, while the coupling portion 21 which couples the plurality of movable electrodes 20 is supported via the beam portion 22 having the spring characteristic with respect to the supporting substrate 14, in the plural movable electrodes 20, there is one of the features. That is, while the beam portion 22 is located at the center, the first movable electrode 20a of one side and the second movable electrode 20b of the other side are displaced in the opposite directions along the first direction "Z" due to the spring characteristic of the beam portion 22, namely perform seesaw-shaped displacement.

According to this featured point, the acceleration can be detected based upon a change in the capacitance difference (C2–C1) between the capacitance C1 produced between the first movable electrode 20a and the fixed electrode 30, and the capacitance C2 produced between the second movable electrode 20b and the fixed electrode 30 in conjunction with this seesaw-shaped displacement, as indicated in FIG. 3, so that the sensitivity having the superior linearity can be obtained.

Furthermore, in accordance with the acceleration sensor 100 of the first embodiment, there is one of the features as follows: That is, the weight portion 23 for performing the seesaw-shaped displacement is provided on the one-sided portion of the coupling portion 21, while the beam portion 22 is located as the center. Then, in accordance with this feature, the above-described seesaw-shaped displacement can be properly realized by the weight of the weight portion 23.

Also, in accordance with the acceleration sensor 100 of the first embodiment, there is one of the features as follows: That is, both the silicon semiconductor layer 12 and the supporting substrate 14 are made of either mono-crystal silicon or epitaxial-grown polysilicon.

Also, in accordance with the first embodiment, as the acceleration sensor manufacturing method capable of properly manufacturing the acceleration sensor 100 shown in FIG. 1, manufacturing methods having the below-mentioned feature points are provided:

This manufacturing method is comprised of the below-mention trench forming step: while the semiconductor substrate 10 is prepared which is made by stacking the semiconductor layer 12 on the supporting substrate 14, the trench etching process operation is carried out with respect to the silicon semiconductor layer 12 along the first direction "Z" perpendicular to the substrate plane of the semiconductor substrate 10, so that the pattern of the movable electrode 20 and the pattern of the fixed electrode 30 which is located opposite to the movable electrode 20 with the detection interval 40, are formed on the silicon semiconductor layer 12 along the second direction "X" parallel to the substrate plane of the semiconductor substrate 10.

In the above-described trench forming step, the pattern of the movable electrode 20 and the pattern of the fixed electrode 30 are formed in such a manner that the electrode width of the movable electrode 20 along the second direction "X" is made smaller than the electrode width of the fixed electrode 30 along the second direction "X".

The manufacturing method is provided with the release step for releasing the movable electrode 20 from the supporting substrate 14 by side-etching the bottom portion of the movable electrode 20 and the bottom portion of the fixed electrode 31 on the side of the supporting substrate 14 via the trench 15 formed by the above-explained trench etching process operation.

As previously explained, in accordance with the method for manufacturing the acceleration sensor 100 of this first embodiment with employment of these featured points, this acceleration sensor 100 can be manufactured by that the movable electrode 20 and the fixed electrode 30 are patterned by performing the trench etching operation in such a manner that the width of the movable electrode 20 is made smaller than the width of the fixed electrode 30 along the second direction "X", namely the parallel direction of the substrate plane in the trench forming step, and subsequently, the bottom portions of both the electrodes 20 and 30 are side-etched so as to release the movable electrode 20 in the release step.

Then, when this side etching process operation is performed, releasing of the movable electrode 20 having the narrower electrode width can be completed from the supporting substrate 14 as the bed faster than the fixed electrode 30 having the wider electrode width. As a result, the electrode thickness of the movable electrode 20 along the first direction "Z" which is the vertical direction of the substrate plane may be made thinner than the electrode thickness of the fixed electrode 30.

As previously explained, in the release step, releasing of the movable electrode 20 corresponding to the narrow width portion as the remaining portion by the trench etching process operation is completed faster than releasing of the fixed electrode 30 corresponding to the wide width portion. This etching effect is determined based upon physical dimensions of the subjects to be etched, so that the control characteristic becomes superior than that in the case that the RIE lag is utilized.

As a consequence, also, according to the manufacturing method of the first embodiment, in the vertical displacement type acceleration sensor 100, both the movable electrode 20 and the fixed electrode 30 can be realized under stable condition.

In the manufacturing method of the first embodiment, as one of the featured points, the side etching process operation is accomplished in such a manner that in the release step, the movable electrode 20 is released from the supporting substrate 14, and further, the fixed electrode 30 is not released from the supporting substrate 14 in the detection intervals 40.

Accordingly, in the accomplished acceleration sensor, in the detection interval 40, such a condition is formed properly that the movable electrode 20 is separated from the supporting substrate 14, and the fixed electrode 30 is supported by the supporting substrate 14 under contact state.

Second Embodiment

Figure 8A:
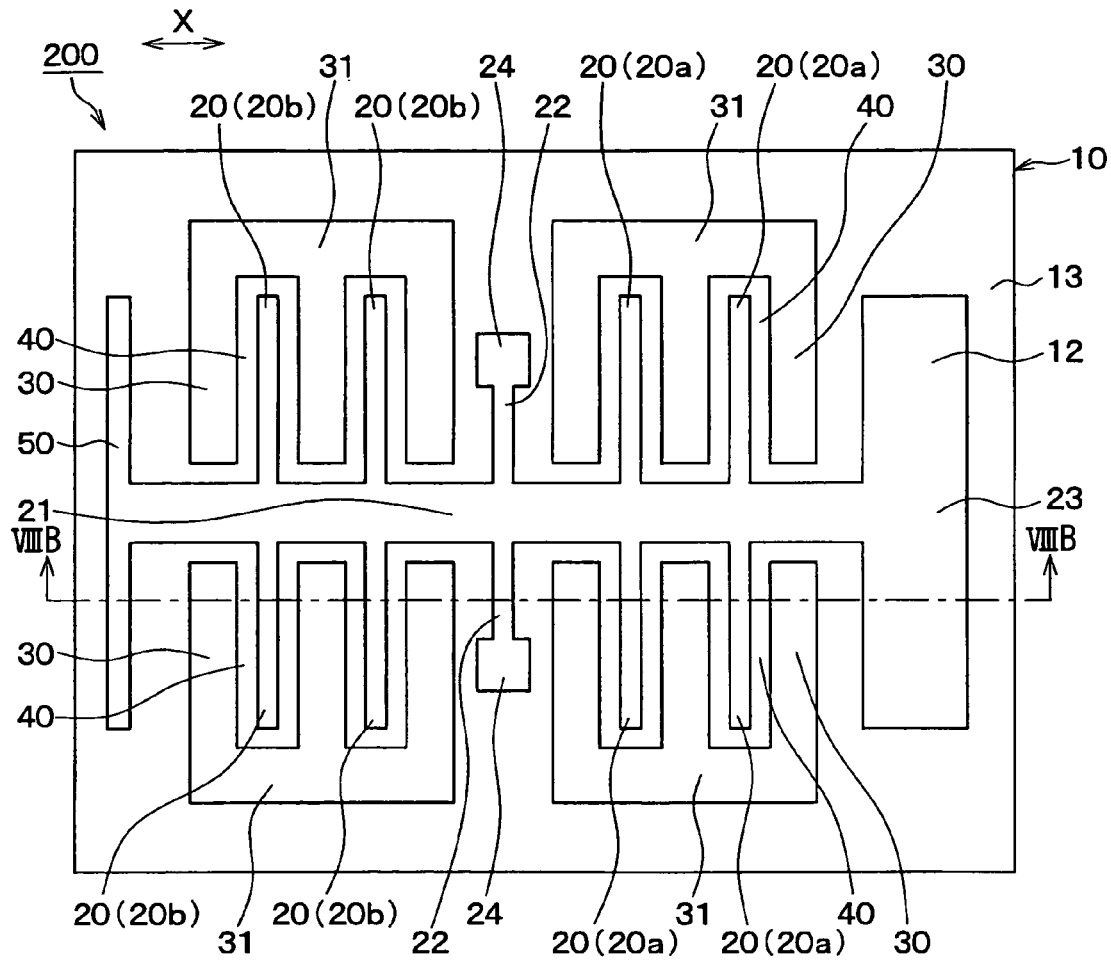
FIG. 8A is a schematic plan view showing an acceleration sensor according to a second embodiment of the present invention.
Figure 8B:
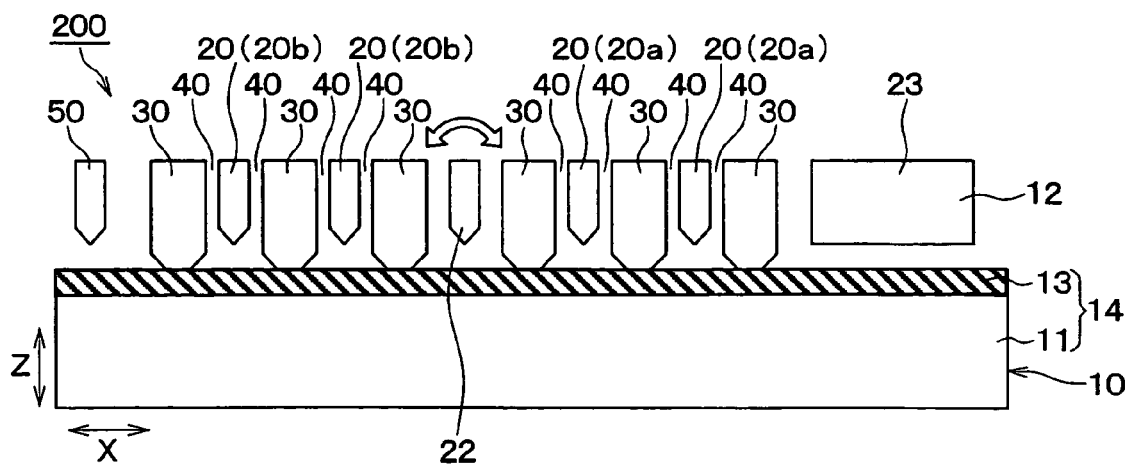
FIG. 8B is a cross sectional view showing the sensor taken along line VIIIB-VIIIB in FIG. 8A.

FIGS. 8A and 8B are diagrams for schematically showing a structure of an acceleration sensor 200 according to a second embodiment of the present invention. Concretely speaking, FIG. 8A is a plan view for schematically showing the acceleration sensor 200, and FIG. 8B is a sectional view for schematically indicating the acceleration sensor 200, taken along a dot/dash line VIIIB-VIIIB of FIG. 8A.

As shown in FIGS. 8A and 8B, similarly, the acceleration sensor 200 according to this second embodiment is featured by having the below-mentioned basic structure. That is to say, a vertical displacement type acceleration sensor corresponding to this acceleration sensor 200 is provided with a semiconductor substrate 10 made by stacking a silicon semiconductor layer 12 on a supporting substrate 14; a trench etching process operation is carried out with respect to the silicon semiconductor layer 12 along a first direction "Z", so that both a movable electrode 20 and a fixed electrode 30 are patterned on the silicon semiconductor layer 12; when acceleration is applied to this acceleration sensor 200 along the first direction "Z", the movable electrode 20 is displaced along the first direction "Z"; and then, the applied acceleration is detected based upon the capacitance change produced between the movable electrode 20 and the fixed electrode 30 in conjunction with this displacement.

Then, similar to the above-described first embodiment, this acceleration sensor 200 owns the below-mentioned specific features: The movable electrode 20 has been released from the supporting substrate 14 by the above-described side etching process operation via the trench 15. Also, a width of the movable electrode 20 along the second direction "X" and a thickness thereof along the first direction "Z" are made smaller than those of the fixed electrode 30.

Accordingly, similar to the above-described first embodiment, also, in accordance with this second embodiment, in the vertical displacement type acceleration sensor 200, both the movable electrode 20 and the fixed electrode 30 can be manufactured under stable structures. In this vertical displacement type acceleration sensor 200, both the movable electrode 20 and the fixed electrode 30 are patterned and formed by the trench etching process operation on the silicon semiconductor layer 12 stacked on the supporting substrate 14, and when the acceleration is applied along the vertical direction of the substrate plane, the applied acceleration is detected based upon the capacitance change produced between the movable electrode 20 and the fixed electrode 30.

Also, in the acceleration sensor 200 of the second embodiment, a coupling portion 21 which couples the plurality of movable electrodes 20 is supported via a beam portion 22 with respect to the supporting substrate 14. In the plural movable electrodes 20, while the beam portion 22 is located at a center, a first movable electrode 20a of one side and a second movable electrode 20b of the other side are displaced in the opposite directions to each other along the first direction "Z" due to the spring characteristic of the beam portion 22, namely perform seesaw-shaped displacement. The acceleration can be detected based upon a change in the capacitance difference (C2–C1).

In such a structure that the seesaw-shaped displacement is performed, when a weight portion 23 is provided on one side of the beam portion 22 in the coupling portion 21, there are some cases that a capacitance may be produced between this weight portion 23 and the fixed electrode 30 of the peripheral portion thereof.

As a result, since the capacitance is formed by this weight portion 23, an unbalance capacitance may be produced between one side and the other side while the beam portion 22 is located at the center, namely, on the side of the first movable electrode 20a and on the other side of the second movable electrode 20b.

For instance, in the case of the acceleration sensor 100 shown in FIGS. 1A and 1B, the capacitance portion is formed between the weight portion 23 provided on the side of the first movable electrode 20a and the fixed electrode 30 adjacent to this first movable electrode 20a. As a result, while the beam portion 22 is located at the center, a total number of capacitance portions formed on the side of the first movable electrode 20a becomes larger than those of the second movable electrode 20b by the capacitance portion formed by the weight portion 23. It can be understood from FIGS. 1A and 1B that the interval between the weight portion 23 and the fixed electrode 30 adjacent to this weight portion 23 is made slightly wider than the detection interval 40 between the movable electrode 20 and the fixed electrode 30.

As a result, when the acceleration is detected, if the above-described capacitance difference (C2–C1) is employed, then the process operation executed in the circuit becomes complex, resulting in an unwanted effect. In other words, in the case of such a vertical displacement type acceleration sensor for performing the seesaw-shaped displacement, it is preferable that a total number of the capacitance portions formed on the side of the first movable electrode 20a is equal to a total number of the capacitance portions formed on the side of the second movable electrode 20b.

To solve such a problem, as indicated in FIG. 8, in the acceleration sensor 200 of the second embodiment, a capacitance compensating portion 50 has been formed at a portion of the coupling portion 21, which is located opposite to the portion thereof where the weight portion 23 is provided while the beam portion 22 is located at the center, namely, at an edge portion of the coupling portion 21 on the side of the second movable electrode 20b. This capacitance compensating portion 50 is to compensate the capacitance portion formed by the weight portion 23.

In this case, the capacitance compensating portion 50 has been formed with the movable structural members 20 to 23 in an integral body as a portion of these movable structure members 20 to 23. The weight of this capacitance compensating portion 50 is largely lighter than the weight of the weight portion 23, and owns such a mass which essentially does not disturb displacement made by this weight portion 23.

Also, an interval between the capacitance compensating portion 50 and the fixed electrode 30 adjacent to this capacitance compensating portion 50 is made substantially equal to the interval between the weight portion 23 and the fixed electrode 30 adjacent to this weight portion 23. Further, the capacitance formed by the capacitance compensating portion 50 is made substantially equal to the capacitance formed by the weight portion 23.

As previously explained, since the capacitance compensating portion 50 is provided, another capacitance portion is formed between this capacitance compensating portion 50 and the fixed electrode 30 adjoining to this capacitance compensating portion 50. Therefore, a total number of the capacitance portions formed on the side of the first movable electrode 20a can be made equal to a total number of the capacitance portions formed on the side of the second movable electrode 20b while the beam portion 22 is located at the center.

As previously explained, in accordance with this second embodiment, in the acceleration sensor 200 for performing the seesaw-shaped displacement, the unbalanced capacitance condition formed between the sides of the first movable electrode 20a and the second movable electrode 20b can be corrected which is caused by the weight portion 23. As a result, the acceleration can be readily detected based upon the capacitance difference (C2–C1) during the acceleration detecting operation.

As previously explained, the second embodiment is featured by merely applying the capacitance compensating portion 50 with respect to the acceleration sensor 100 of the first embodiment, and other structural members are identical to each other. As a consequence, in addition to the effects which are newly described in this second embodiment, in accordance with the acceleration sensor 200 of the second embodiment, similar operation/effects to those of the first embodiment can be apparently achieved.

Other Embodiments

Figure 9:
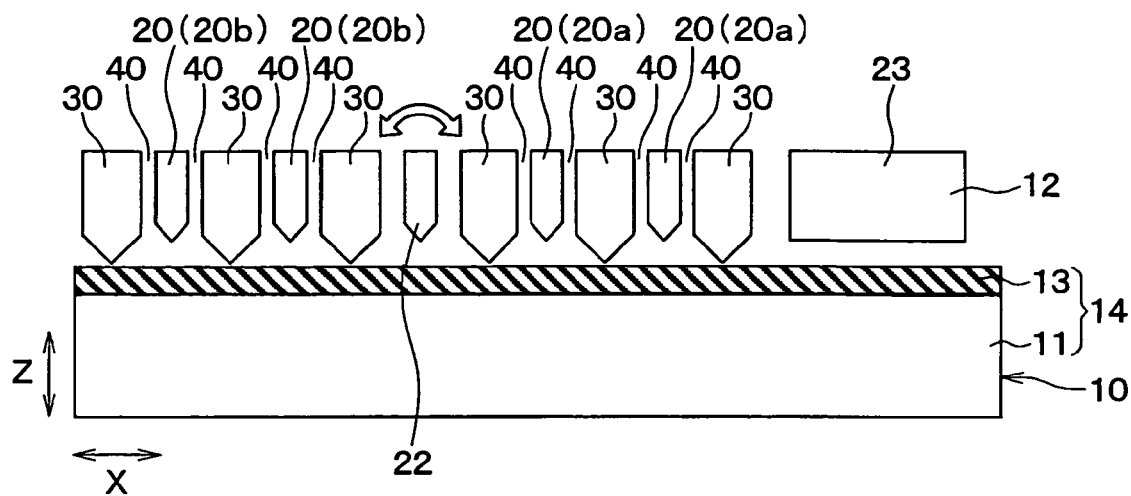
FIG. 9 is a cross sectional view showing an acceleration sensor according to another embodiment of the present invention.

In the above-described embodiments, the bottom portion of the movable electrode 20 on the side of the supporting substrate 14 has been made in either the taper shape or the round shape in such a manner that the bottom portion becomes narrow directed to the supporting substrate 14. It should be understood that this bottom portion need not be formed in either the taper shape or the round shape, but may be alternatively formed, for example, in a straight shape as represented in FIG. 9.

Figure 10:
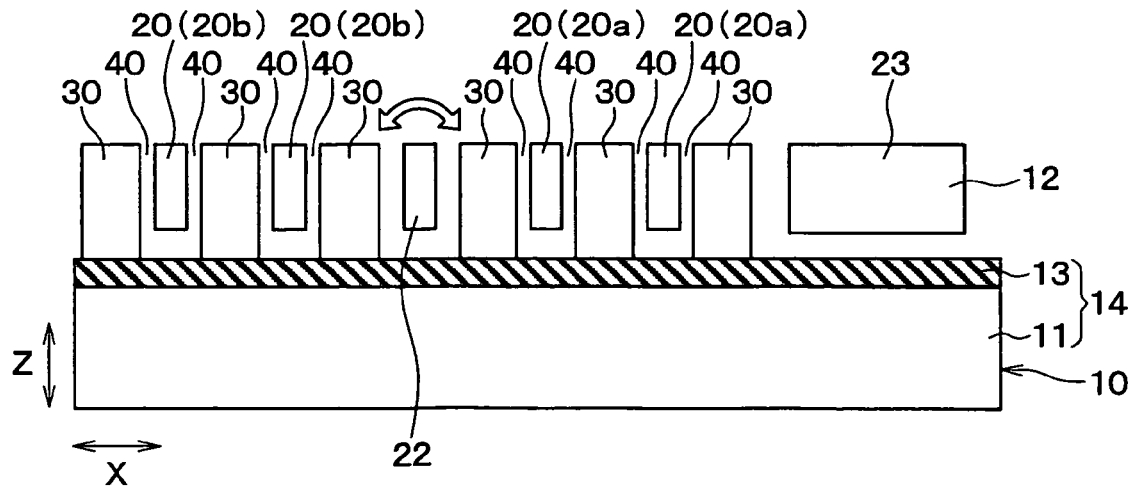
FIG. 10 is a cross sectional view showing an acceleration sensor according to further another embodiment of the present invention.

FIG. 10 is a sectional view for schematically showing an acceleration sensor as another embodiment of the present invention. In the above-described acceleration sensors 100 and 200 of the embodiments, in the detection interval 40, the movable electrode 20 has been separated from the supporting substrate 14, and the fixed electrode 30 has been supported by the supporting substrate 14 in the contact manner.

In contrast, as indicated in FIG. 10, the fixed electrode 30 may also be released to be separated from the supporting substrate 14. It should also be understood that the structures of these acceleration sensors shown in FIG. 9 and FIG. 10 may be formed by adjusting the electrode widths of the respective electrodes 20 and 30, and also, timing of a side etching process operation.

Also, in the above-described embodiments, since the beam portion 22 is coupled to the intermediate portion of the coupling portion 21, the movable electrode 20 performs the above-explained seesaw-shaped displacement. However, the displacement mode of the movable electrode 20 is not limited only to this seesaw-shaped displacement. For example, since the spring characteristic of the beam portion 22 is changed, all of the movable electrodes 20a and 20b may be alternatively displaced parallel to the first direction "Z".

Also, the semiconductor substrate is not limited only to the above-described SOI substrate, but may be realized by stacking a silicon semiconductor layer on a supporting substrate.

Also, the structures of the movable electrode and the fixed electrode formed on the silicon semiconductor layer of the semiconductor substrate are not limited only to the above-explained comb-teeth shapes. That is, while the movable electrode is released from the supporting substrate of the semiconductor substrate, when acceleration is applied along the first direction "Z" perpendicular to the substrate plane of the semiconductor substrate, the movable electrode may be displaced along this first direction "Z".

Also, the fixed electrode is located opposite to the movable electrode along the second direction "X" parallel to the substrate plane of the semiconductor substrate, while having the detection interval. Thus, when the acceleration is applied, the fixed electrode is not displaced, but may be fixed on the supporting substrate.

In summary, the present invention may be applied to any of vertical displacement type acceleration sensor if this vertical displacement type acceleration sensor is realized based upon the following structures. That is, while a semiconductor substrate made by stacking a silicon semiconductor layer on a supporting substrate is prepared, since a trench etching process operation is carried out along a first direction equal to a vertical direction of the substrate plane with respect to the silicon semiconductor layer, both a movable electrode and a fixed electrode located opposite to the movable electrode, having a detection interval along a second direction equal to parallel direction of the substrate plane, are patterned on the silicon semiconductor layer. When acceleration is applied, this applied acceleration is detected based upon a capacitance change between the movable electrode and the fixed electrode in conjunction with the displacement of the movable electrode along the first direction.

Then, the present invention is to provide the above-explained manufacturing method capable of properly manufacturing the above-explained acceleration sensor having the following major featured portions: That is, since the bottom portions in the movable electrode 20 and the fixed electrode 30 on the side of the supporting substrate 14 are side-etched via the trench 15 formed by the trench etching process operation, the movable electrode 20 is released from the supporting substrate 14. Also, the width of the movable electrode 20 along the second direction "X" is made narrower than the width of the fixed electrode 30, and the thickness of the movable electrode 20 along the first direction "Z" is made thinner than the thickness of the fixed electrode 30.

Alternatively, as apparent from the foregoing description, a parallel displacement type acceleration sensor may be arranged on the same semiconductor chip as the vertical displacement type acceleration sensor of the present invention by employing the manufacturing method described in the present invention. As a consequence, an acceleration sensor of 3 axes may be easily realized.

The present invention generally relates to an acceleration sensor and a manufacturing method thereof. More specifically, the present invention is directed to a vertical displacement type acceleration sensor for detecting acceleration in such a manner that both a moveable electrode and a fixed electrode are patterned/formed on a silicon semiconductor layer stacked on a supporting substrate by way of a trench etching treatment, and acceleration is detected based upon a capacitance change between the movable electrode and the fixed electrode when the acceleration is applied along a vertical direction of the substrate plane, and also is directed to a method for manufacturing the vertical displacement type acceleration sensor.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:
1. An acceleration sensor comprising:
a semiconductor substrate including a support layer and a semiconductor layer, which are stacked in a first direction perpendicular to the semiconductor substrate;
a movable electrode and a fixed electrode disposed in the semiconductor layer; and
a trench disposed on the semiconductor layer and reaching the support layer, wherein
the movable electrode separately faces the fixed electrode by sandwiching the trench along a second direction, which is parallel to the semiconductor substrate,
the trench has a detection distance in the second direction,
the movable electrode is movable along the first direction when acceleration is applied to the semiconductor substrate along the first direction so that the acceleration is detected on the basis of capacitance change of a capacitor between the movable electrode and the fixed electrode,
the movable electrode has a bottom, which faces the support layer and is apart from the support layer,
the movable electrode has a width along the second direction, and the fixed electrode has a width along the second direction,
the width of the movable electrode is smaller than the width of the fixed electrode,
the movable electrode has a thickness along the first direction, and the fixed electrode has a thickness along the first direction, and
the thickness of the movable electrode is smaller than the thickness of the fixed electrode,
the movable electrode includes a first movable portion, a second movable portion, a connection portion, and a spring,
the connection portion connects between the first movable portion and the second movable portion,
the connection portion is supported on the support layer through the spring,
the first movable portion is disposed on an opposite side of the second movable portion through the spring as a center,
the first movable portion and the second movable portion are capable of displacing with a see-saw mechanism by the spring so that a movable direction of the first movable portion is opposite to a movable direction of the second movable portion,
the first movable portion and the fixed electrode provide a first capacitance, and the second movable portion and the fixed electrode provide a second capacitance,
the acceleration is detected on the basis of capacitance change of a difference between the first capacitance and the second capacitance,
the movable electrode further includes a weight portion,
the weight portion is disposed on one side of the connection portion,
the weight portion promotes the see-saw mechanism,
the movable electrode further includes a capacitance compensation portion, which is disposed on the other side of the connection portion so that the capacitance compensation portion is opposite to the weight portion, and
the capacitance compensation portion compensates a capacitance, which is provided by the weight portion.
2. The sensor according to claim 1, wherein
the fixed electrode is supported on the support layer so that the fixed electrode contacts the support layer, and the movable electrode is apart from the support layer at least at a point, at which the detection distance of the trench is defined.

3. The sensor according to claim 1, wherein
the support layer includes a first silicon layer and an insulation layer,
the semiconductor layer provides a second silicon layer, and
the first silicon layer, the insulation layer and the second silicon layer are stacked in this order so that the semiconductor substrate provides a SOI substrate.

4. The sensor according to claim 1, wherein
the movable electrode has a comb-teeth shape, and the fixed electrode has a comb-teeth shape, and
the comb-teeth shape of the movable electrode is interleaved with the comb-teeth shape of the fixed electrode so that a distance between one comb-tooth of the movable electrode and a corresponding one comb-tooth of the fixed electrode provides the detection distance.

5. The sensor according to claim 1, wherein
the bottom of the movable electrode has a tapered shape or a rounding shape so that a width of the movable electrode becomes smaller as the movable electrode goes toward the support layer.

6. The sensor according to claim 1, wherein
the semiconductor layer is made of single crystal silicon or epitaxial poly-crystal silicon.

7. The sensor according to claim 1, wherein
the support layer is made of single crystal silicon or epitaxial poly-crystal silicon.

8. An acceleration sensor comprising:
a support layer;
a semiconductor layer stacked over the support layer in a first direction perpendicular to the support layer, the semiconductor layer including a movable electrode and a fixed electrode; and
a trench disposed in the semiconductor layer between the movable electrode and the fixed electrode, and reaching the support layer,
wherein the trench provides a detection interval between portions of the movable electrode and portions of the fixed electrode in a second direction parallel to the semiconductor substrate,
wherein the movable electrode is movable in the first direction when acceleration is applied to the acceleration sensor in the first direction so that the acceleration of the acceleration sensor is detected on the basis of a capacitance change of a capacitor formed between the movable electrode and the fixed electrode,
wherein the movable electrode has a bottom, which faces the support layer and is apart from the support layer,
wherein the movable electrode has a first width in the second direction, and the fixed electrode has a second width in the second direction, and
wherein the first width is smaller than the second width,
wherein the movable electrode includes a first movable portion, a second movable portion, a connection portion, and a spring,
wherein the connection portion is provided on the movable electrode between the first movable portion and the second movable portion,
wherein the connection portion is supported on the support layer through the spring,
wherein the first movable portion and the second movable portion are capable of moving in a see-saw motion with respect to the spring so that a first moving direction of the first movable portion is opposite to a second moving direction of the second movable portion,
wherein the first movable portion and the fixed electrode provide a first capacitance, and the second movable portion and the fixed electrode provide a second capacitance, and
wherein the acceleration of the acceleration sensor is detected on the basis of a capacitance change of a difference between the first capacitance and the second capacitance.

9. The sensor according to claim 8,
wherein the fixed electrode is supported on the support layer so that the fixed electrode contacts the support layer, and
wherein at least a portion of the movable electrode is apart from the support layer.

10. The sensor according to claim 8,
wherein the movable electrode has a first comb-teeth shape,
wherein the fixed electrode has a second comb-teeth shape, and
wherein the first comb-teeth shape of the movable electrode is interleaved with the second comb-teeth shape of the fixed electrode so that a distance between one comb-tooth of the movable electrode and a corresponding one comb-tooth of the fixed electrode provides the detection interval.

* * * * *